United States Patent
Tani et al.

(10) Patent No.: US 10,784,182 B2
(45) Date of Patent: Sep. 22, 2020

(54) BONDED SUBSTRATE AND METHOD FOR MANUFACTURING BONDED SUBSTRATE

(71) Applicant: NGK INSULATORS, LTD., Nagoya (JP)

(72) Inventors: Makoto Tani, Inazawa (JP); Yasutaka Awakura, Kakamigahara (JP); Takeshi Kaku, Nagoya (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 82 days.

(21) Appl. No.: 15/657,710

(22) Filed: Jul. 24, 2017

(65) Prior Publication Data

US 2017/0323842 A1 Nov. 9, 2017

Related U.S. Application Data

(63) Continuation of application No. PCT/JP2016/005212, filed on Dec. 22, 2016.

(30) Foreign Application Priority Data

Dec. 28, 2015 (WO) .................. PCT/JP2015/086477

(51) Int. Cl.
*H01L 23/373* (2006.01)
*H01L 21/48* (2006.01)
(Continued)

(52) U.S. Cl.
CPC .......... *H01L 23/3735* (2013.01); *B32B 15/04* (2013.01); *B32B 15/20* (2013.01);
(Continued)

(58) Field of Classification Search
None
See application file for complete search history.

(56) References Cited

U.S. PATENT DOCUMENTS 5,153,077 A 10/1992 Kashiba et al.
5,251,803 A 10/1993 Kashiba et al.
(Continued)

FOREIGN PATENT DOCUMENTS

JP 02-177463 A1 7/1990
JP 05-032463 A1 2/1993
(Continued)

OTHER PUBLICATIONS

Yasutoshi Kurihara, et al., "Bonding Mechanism Between Aluminum Nitride Substrate and Ag—Cu—Ti Solder," *IEEE Transactions on Components, Hybrids, and Manufacturing Technology*, Jun. 1992, vol. 15, Issue 3, pp. 361-368.
(Continued)

*Primary Examiner* — John J Figueroa
(74) *Attorney, Agent, or Firm* — Burr & Brown, PLLC

(57) ABSTRACT

Provided is a bonded substrate mainly for mounting a power semiconductor in which the reliability to a thermal cycle has been enhanced as compared with a conventional one. In a bonded substrate in which a copper plate is bonded to one or both main surface(s) of a nitride ceramic substrate, a bonding layer consisting of TiN intervenes between the nitride ceramic substrate and the copper plate and is adjacent at least to the copper plate, and an Ag distribution region in which Ag atoms are distributed is set to be present in the copper plate. Preferably, an Ag-rich phase is set to be present discretely at an interface between the bonding layer and the copper plate.

9 Claims, 4 Drawing Sheets

(51) Int. Cl.
*B32B 15/04* (2006.01)
*B32B 15/20* (2006.01)
*C04B 35/645* (2006.01)
*C04B 37/02* (2006.01)
*H01L 23/15* (2006.01)

(52) U.S. Cl.
CPC .......... *C04B 35/645* (2013.01); *C04B 37/026* (2013.01); *H01L 21/4846* (2013.01); *B32B 2457/14* (2013.01); *C04B 2237/08* (2013.01); *C04B 2237/125* (2013.01); *C04B 2237/126* (2013.01); *C04B 2237/127* (2013.01); *C04B 2237/366* (2013.01); *C04B 2237/368* (2013.01); *C04B 2237/407* (2013.01); *C04B 2237/60* (2013.01); *C04B 2237/704* (2013.01); *C04B 2237/706* (2013.01); *C04B 2237/708* (2013.01); *C04B 2237/72* (2013.01); *H01L 23/15* (2013.01)

(56) References Cited

U.S. PATENT DOCUMENTS

| | | | |
|---|---|---|---|
| 6,911,728 B2 | 6/2005 | Ishikawa et al. | |
| 7,161,807 B2 | 1/2007 | Ishikawa et al. | |
| 7,433,187 B2 | 10/2008 | Ishikawa et al. | |
| 8,785,785 B2 | 7/2014 | Kato | |
| 9,101,065 B2 | 8/2015 | Kato | |
| 2008/0272180 A1 | 11/2008 | Ishikawa et al. | |
| 2012/0168209 A1 † | 7/2012 | Kato | |
| 2012/0321805 A1* | 12/2012 | Takahashi | H05K 1/092 427/383.5 |
| 2013/0236738 A1* | 9/2013 | Yamauchi | C04B 41/009 428/632 |
| 2014/0192486 A1* | 7/2014 | Kuromitsu | H01L 23/3735 361/715 |
| 2014/0291385 A1* | 10/2014 | Kato | H01L 23/15 228/124.1 |
| 2015/0208496 A1 † | 7/2015 | Terasaki et al. | |
| 2017/0034905 A1 | 2/2017 | Terasaki et al. | |

FOREIGN PATENT DOCUMENTS

| | | |
|---|---|---|
| JP | H05-201777 A † | 8/1993 |
| JP | H05-201777 A1 | 8/1993 |
| JP | 07-069750 A1 | 3/1995 |
| JP | 2000-335983 A1 | 12/2000 |
| JP | 2002-043482 A1 | 2/2002 |
| JP | 2002-359453 A1 | 12/2002 |
| JP | 2003-192462 A † | 7/2003 |
| JP | 2003-192462 A1 | 7/2003 |
| JP | 2003-283064 A1 | 10/2003 |
| JP | 2004-253736 A1 | 9/2004 |
| JP | 3629783 B2 | 3/2005 |
| JP | 4014528 B2 | 11/2007 |
| JP | 4015023 B2 | 11/2007 |
| JP | 2014-207482 A1 | 10/2014 |
| JP | 5637992 B2 | 12/2014 |
| JP | 2015-180600 A1 | 10/2015 |
| JP | 201658706 A | 4/2016 |
| WO | 2011108498 A1 | 9/2011 |
| WO | 2013/115359 A1 | 8/2013 |

OTHER PUBLICATIONS

CherngYuh Su et al., Microstructure and Mechanical Properties of AlN/Cu Brazed Joints, Journal of Materials Engineering and Performance, Jun. 2014, vol. 23, Issue 9, pp. 3299-3304.

Development of Highly Reliable Cooling (Heat-Dissipating) Substrate for SiC Element by Diffusion Bonding Method, Strategic Foundational Technology Upgrading Support Program, Research Development Result Example Cases, Adopted Programs of the year H.24 to • H.25, Kanto Bureau of Economy, Trade and Industry, Industries Department, Manufacturing Industries Division, issued in Mar. 2015, p. 28-29.

International Search Report and Written Opinion (PCT/JP2015/086477) dated Mar. 15, 2016.

International Search Report and Written Opinion (Application No. PCT/JP2016/005212) dated Mar. 17, 2017.

Extended European Search Report (Application No. 15882900.2) dated Mar. 27, 2017.

English translation of International Preliminary Report on Patentability (Chapter I) (Application No. PCT/JP2016/005212) dated Jul. 12, 2018, 6 pages.

Japanese Notice of Opposition (and English translation) from a corresponding Japanese patent (JP 6482144) dated Oct. 10, 2019, 34 pages.

\* cited by examiner
† cited by third party

[Fig. 1]
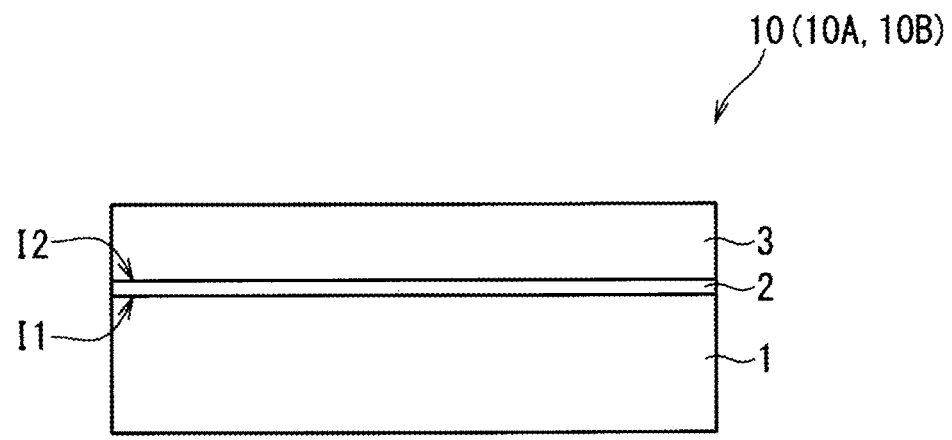
[Fig. 2]
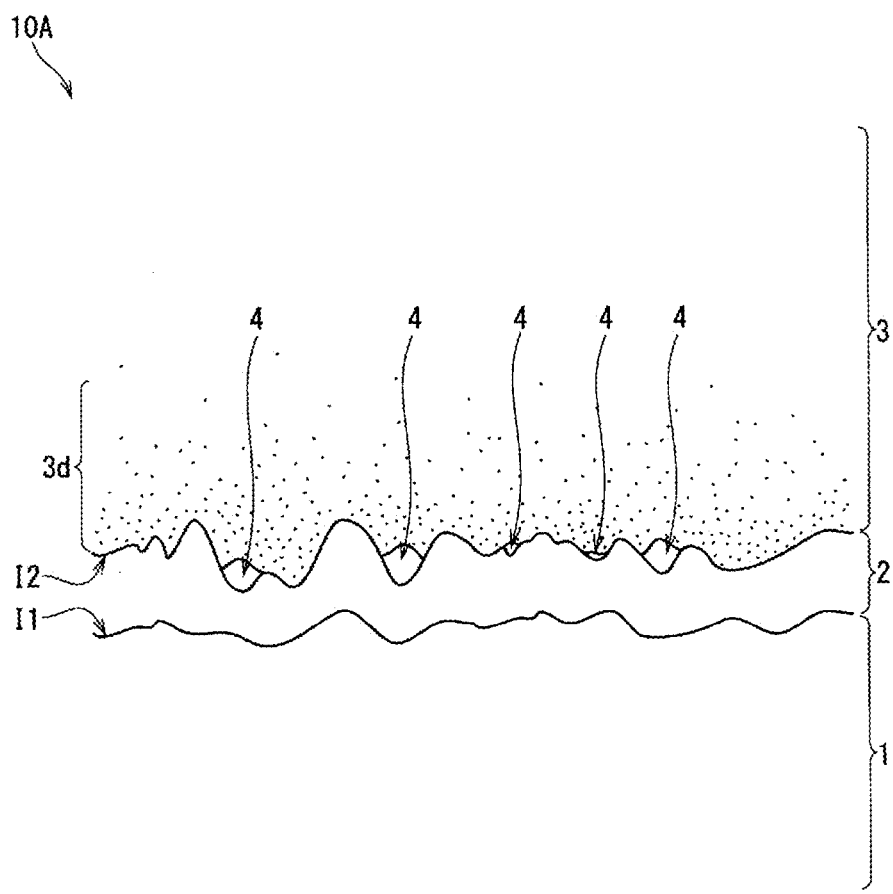

[Fig. 3]
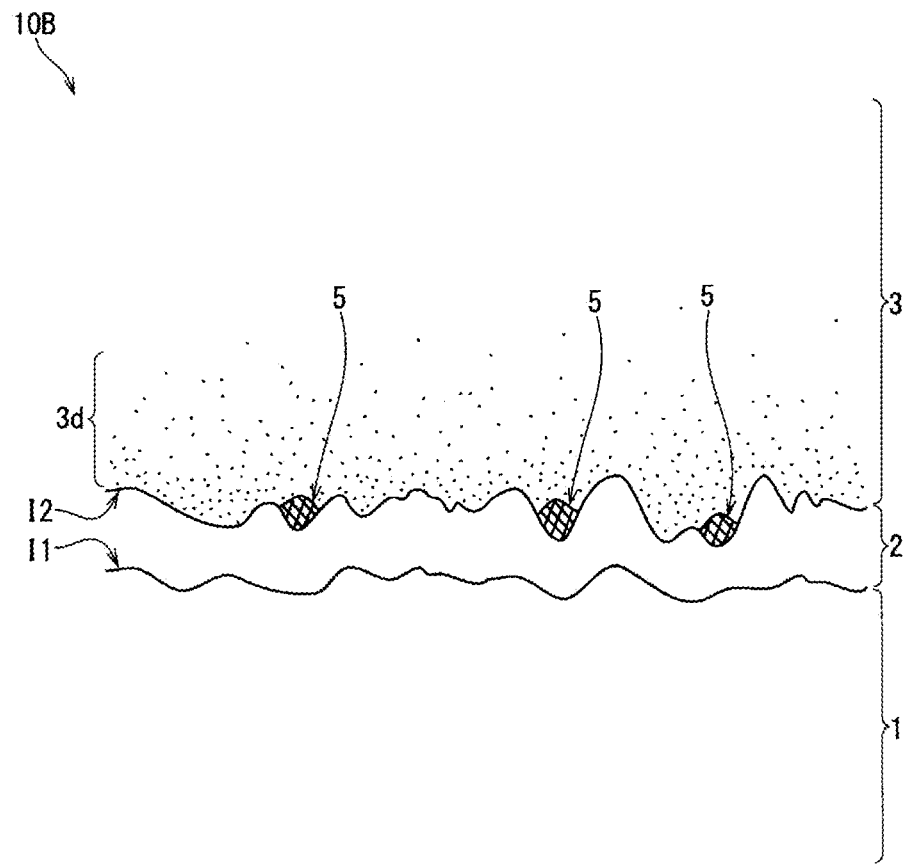
[Fig. 4]
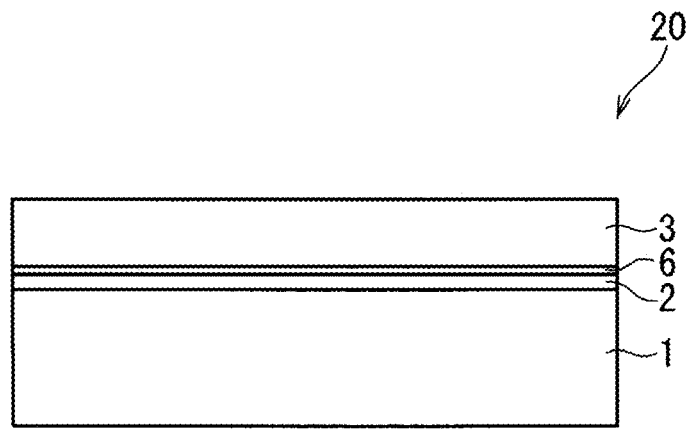

[Fig. 5]
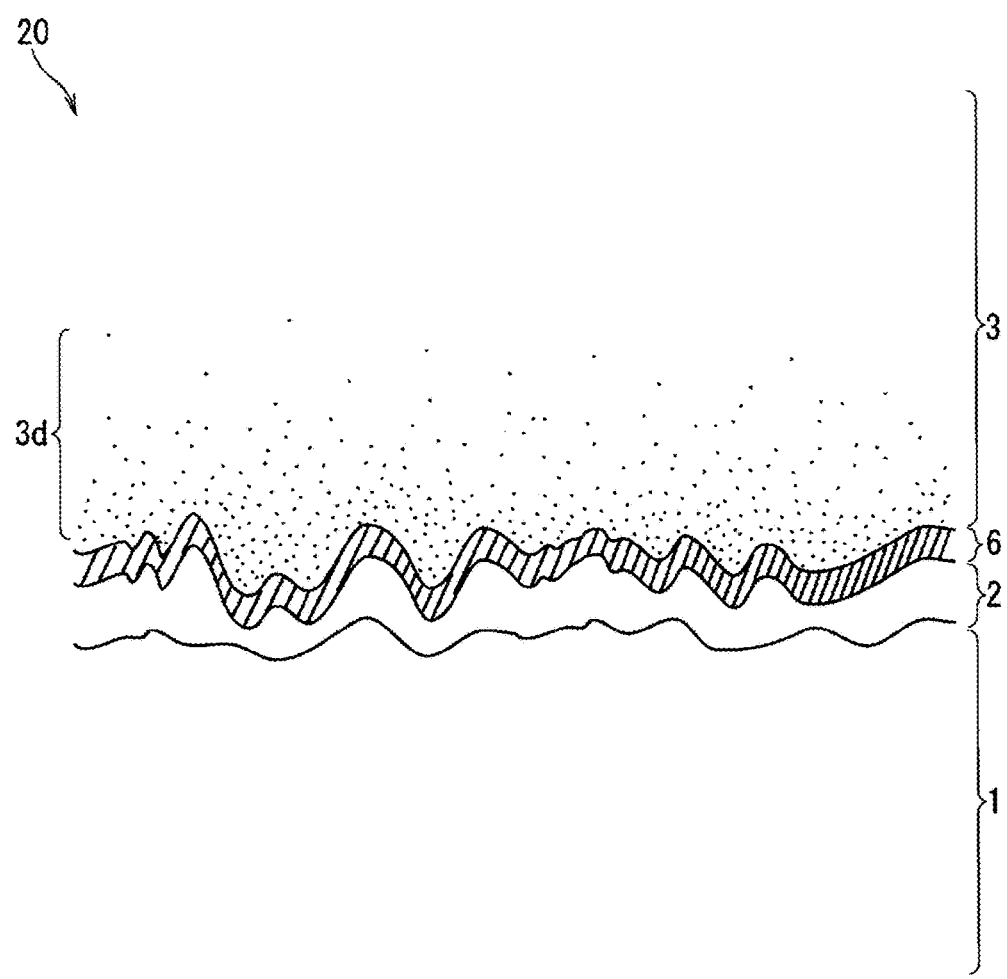

[Fig. 6]
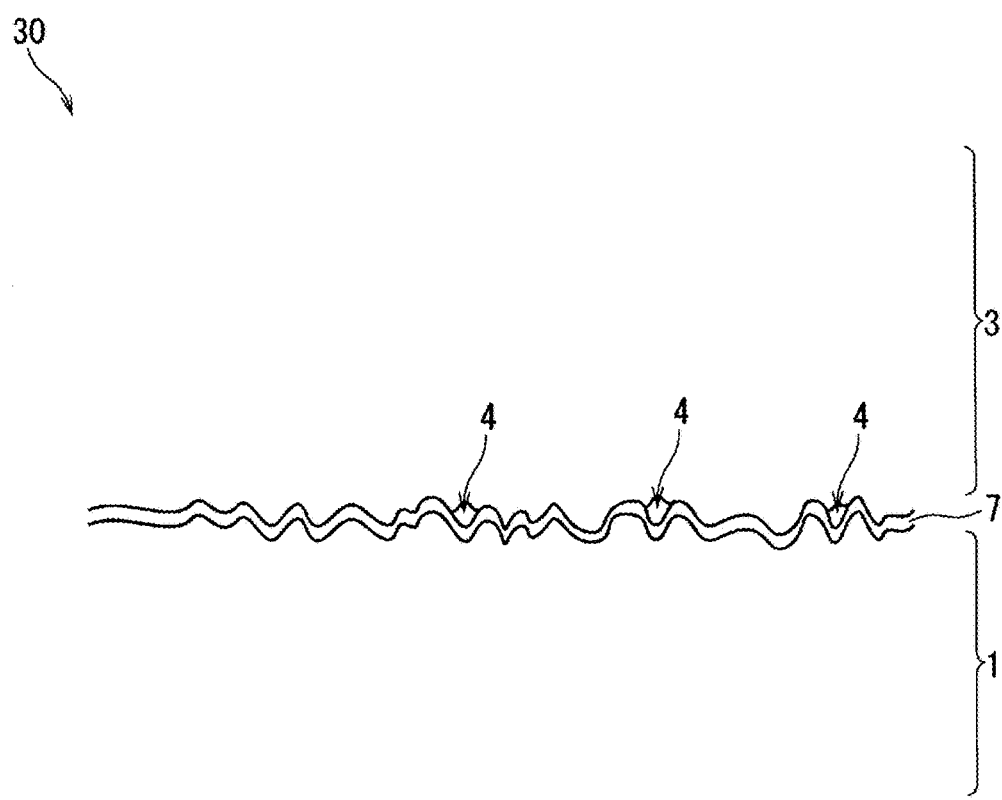
[Fig. 7]
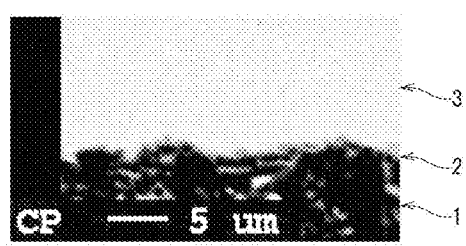
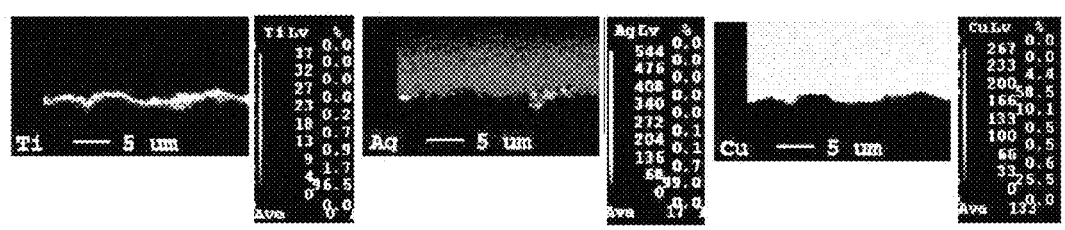

BONDED SUBSTRATE AND METHOD FOR MANUFACTURING BONDED SUBSTRATE

BACKGROUND OF THE INVENTION

1. Field of the Invention

The present invention relates to a substrate on which a power semiconductor is mounted, and particularly to a bonded substrate in which a copper plate is bonded to a ceramic substrate by using a brazing material.

2. Description of Related Art

A power semiconductor module is used for electric power control of an HEV/EV, an electric railcar, or the like. The power semiconductor module is composed of, for example, an electric circuit for mounting a power semiconductor such as a switching element, an IGBT, or a MOSFET, as well as an insulating heat-dissipating substrate, a cooling member, and a case body. The power semiconductor module is highly heat-generative because of performing a large electric power control and also is used under a thermal cycle environment. For this reason, reliability (durability) to the thermal cycle is demanded in addition to electric insulation property and heat-dissipating property in the insulating heat-dissipating substrate on which the power semiconductor is mounted.

Conventionally, as an insulating heat-dissipating substrate, there has been widely known a DCB substrate in which a thin copper plate is directly bonded to an alumina substrate, an aluminum nitride substrate, a silicon nitride substrate, or the like. Also, a mode has been already known in which a silicon nitride substrate and a copper plate are bonded by the diffusion bonding method (for example, see Non-Patent Literature 1).

Furthermore, as an insulating heat-dissipating substrate, there has been widely known an AMB substrate in which a thin copper plate and a ceramic substrate such as an alumina substrate, an aluminum nitride substrate, or a silicon nitride substrate are bonded through a bonding layer formed by using a brazing material (bonding material) containing an active metal. As the AMB substrate, one in which the bonding layer has been formed with use of a brazing material containing Ag (for example, see Patent Literature 1 and Patent Literature 2) and one in which the bonding layer has been formed with use of a brazing material not containing Ag (for example, see Patent Literature 3 and Patent Literature 4) are both known.

Also, heated and pressurized bonding has been already known as a technique for bonding an insulating substrate and a metal plate (circuit substrate) with a brazing material (for example, see Patent Literature 5 to Patent Literature 9).

In recent years, improvement in output density as well as scale reduction have been demanded in the power semiconductor modules. By receiving such a demand, studies have been made on increasing the thickness of the copper plate for the purpose of satisfying both of the heat-dissipating property and the scale reduction in the insulating heat-dissipating substrate used in the power semiconductor modules.

However, in the case that a thick copper plate is used, a heat stress generated at the bonding end of the copper plate and the ceramic substrate increases due to the thermal expansion difference between copper and ceramics, thereby raising a problem that cracks are generated in the ceramic substrate because of the residual heat stress generated by the heat treatment at the time of bonding the ceramic substrate and the copper plate and the repeated heat stress generated by temperature change at the time of actual use.

The inventors of the present invention have found out, as a result of eager studies, that in an AMB substrate whose bonding layer is formed by using a brazing material containing Ag, the mode of presence of Ag in a vicinity of the interface between the copper plate and the bonding layer exerts an influence on the reliability to the thermal cycle.

None of Patent Literature 1, Patent Literature 2, and Patent Literature 5 to Patent Literature 9 discloses or suggests the relationship between the thermal cycle and the mode of presence of Ag in a vicinity of the interface between the copper plate and the bonding layer in the AMB substrate.

For example, Patent Literature 1 discloses merely a technique of attaining improvement in the heat-resistant cycle by disposing a brazing material extrusion part with few defects such as voids.

Also, Patent Literature 2 discloses merely a technique of improving the heat-resistant cycle property by adjusting the composition of the silicon nitride substrate itself and the number of grain boundaries.

CITATION LIST

Patent Literature

[PTL 1] Japanese Patent Application Laid-open No. 2014-207482

[PTL 2] Japanese Patent No. 3629783

[PTL 3] Japanese Patent Application Laid-open No. 2003-283064

[PTL 4] Japanese Patent Application Laid-open No. 05-32463

[PTL 5] Japanese Patent Application Laid-open No. 2002-43482

[PTL 6] Japanese Patent Application Laid-open No. 2002-359453

[PTL 7] Japanese Patent Application Laid-open No. 2004-253736

[PTL 8] Japanese Patent No. 4015023

[PTL 9] Japanese Patent No. 4014528

Non Patent Literature

[NPL 1] "Development of Highly Reliable Cooling (Heat-Dissipating) Substrate for SiC Element by Diffusion Bonding Method", Strategic Foundational Technology Upgrading Support Program, Research Development Result Example Cases, Adopted Programs of the year H.24 to H.25, Kanto Bureau of Economy, Trade and Industry, Industries Department, Manufacturing Industries Division, issued in March, 2015, p. 28-29.

SUMMARY OF THE INVENTION

The present invention has been made in view of the aforementioned problems, and an object thereof is to provide a bonded substrate mainly for mounting a power semiconductor in which the reliability to a thermal cycle has been enhanced as compared with a conventional one.

In order to solve the aforementioned problems, a first aspect of the present invention provides a bonded substrate including a copper plate bonded to one or both main surface(s) of a nitride ceramic substrate, wherein a bonding layer consisting of TiN intervenes between the nitride ceramic substrate and the copper plate and is adjacent at least to the copper plate, and an Ag distribution region is present in the copper plate.

Also, a second aspect of the present invention provides the bonded substrate according to the first aspect, wherein an Ag-rich phase is present discretely at an interface between the bonding layer and the copper plate.

Also, a third aspect of the present invention provides the bonded substrate according to the first or second aspect, wherein the Ag distribution region is present in the copper plate to be in contact with an interface between the copper plate and the bonding layer.

Also, a fourth aspect of the present invention provides a method for manufacturing a bonded substrate including a copper plate bonded to one or both main surface(s) of a nitride ceramic substrate, the method comprising an application step of spreading a brazing material paste containing at least Ag and Ti to one or both main surface(s) of the nitride ceramic substrate and a bonding step of heating and pressurizing the copper plate and the nitride ceramic substrate in vacuum or in an Ar atmosphere in a state in which the copper plate is superposed onto the surface(s) of the nitride ceramic substrate where the brazing material paste has been applied, wherein, by performing the application step and the bonding step, in the bonded substrate, a bonding layer consisting of TiN is generated between the nitride ceramic substrate and the copper plate so as to be adjacent at least to the copper plate, and Ag contained in the brazing material paste is diffused in the copper plate to form an Ag distribution region in the copper plate.

Also, a fifth aspect of the present invention provides the method for manufacturing a bonded substrate according to the fourth aspect, wherein, by performing the application step and the bonding step, further in the bonded substrate, an Ag-rich phase is made to be present discretely at an interface between the bonding layer and the copper plate.

According to the first to fifth aspects of the present invention, there can be obtained a bonded substrate having a high reliability to a thermal cycle and being excellent in the heat-dissipation property.

In particular, according to the second and fifth aspects, there can be obtained a bonded substrate having a high reliability not only to a thermal cycle but also to electric insulation breakdown.

BRIEF DESCRIPTION OF DRAWINGS

FIG. 1 shows a view schematically illustrating a cross-sectional configuration of a bonded substrate 10 (10A, 10B) according to an embodiment of the present invention.

FIG. 2 shows a cross-sectional view schematically illustrating a fine structure in an interface region between a bonding layer 2 and a copper plate 3 of the bonded substrate 10A.

FIG. 3 shows a cross-sectional view schematically illustrating a fine structure in an interface region between a bonding layer 2 and a copper plate 3 of the bonded substrate 10B FIG. 4 shows a view schematically illustrating a cross-sectional configuration of a bonded substrate 20.

FIG. 5 shows a cross-sectional view schematically illustrating a fine structure in an interface region from a bonding layer 2 to a copper plate 3 of the bonded substrate 20.

FIG. 6 shows a cross-sectional view schematically illustrating a fine structure in an interface region between a bonding layer 7 and a copper plate 3 of a bonded substrate 30.

FIG. 7 shows a view showing together an SEM image with respect to an interface vicinity of Example 9 and an EPMA element mapping image with respect to Ti, Ag, and Cu.

DETAILED DESCRIPTION OF THE INVENTION

<Summary of Bonded Substrate>

FIG. 1 shows a view schematically illustrating a cross-sectional configuration of a bonded substrate 10 (10A, 10B) according to an embodiment of the present invention. The bonded substrate 10 is a substrate on which a power semiconductor not illustrated in the drawings, such as a switching element, an IGBT, or a MOSFET, for example, is mounted in a power semiconductor module including the power semiconductor.

The bonded substrate 10 generally has a configuration in which a copper plate 3 is bonded to one main surface of a ceramic substrate 1 through a bonding layer 2. Such a bonded substrate 10 is obtained by spreading a brazing material in a paste form containing at least Ag and Ti onto one main surface of the ceramic substrate 1, thereafter superposing the copper plate 3 onto the surface on which the brazing material has been applied, and heating and pressurizing in vacuum or in an Ar atmosphere (by heated and pressurized bonding in vacuum or in an Ar atmosphere). In other words, the bonded substrate 10 has a configuration in which the bonding layer 2 is adjacent to both the ceramic substrate 1 and the copper plate 3 at different interfaces. In FIG. 1, it is assumed that the ceramic substrate 1 and the bonding layer 2 form an interface I1, and the bonding layer 2 and the copper plate 3 form an interface I2.

As the ceramic substrate 1, a nitride ceramic substrate such as a silicon nitride ($Si_3N_4$) substrate or an aluminum nitride (AlN) substrate is exemplified. In realizing the present invention, the planar shape and size of the ceramic substrate 1 are not particularly limited; however, from the viewpoint of achieving scale reduction of the power semiconductor module, a ceramic substrate 1 having a rectangular shape in a plan view with one side being about 20 mm to 70 mm long and with a thickness of 0.1 mm to 1.0 mm is exemplified.

The copper plate 3 may have a planar size equal to the planar size of the ceramic substrate 1 or may have a planar size slightly smaller than the planar size of the ceramic substrate 1. The configuration illustrated in FIG. 1 corresponds to the former case. In the latter case, an outer peripheral part of the ceramic substrate 1 is exposed without being bonded to the copper plate 3. Meanwhile, the thickness is preferably about 0.5 mm to 2.0 mm from the viewpoint of achieving scale reduction of the power semiconductor module.

In more detail, the power semiconductor is mounted on a non-bonded surface (a main surface opposite to the side where the bonding layer 2 is present) of the copper plate 3 constituting the bonded substrate 10. In such a case, the copper plate 3 may be prepared as a circuit substrate having an electric circuit pattern formed on itself, and the power semiconductor may be mounted on the electric circuit pattern. However, in the following description, the copper plate is generally referred to simply as a copper plate 3, including a circuit substrate on which such an electric circuit pattern is formed.

The bonding layer 2 is a layer containing TiN as a major component. Such a bonding layer 2 is made of by Ti contained as an active metal in the brazing material and N constituting the ceramic substrate 1, in the process of the above-described heated and pressurized bonding. The bonding layer 2 is generally formed to have a thickness of submicron order to about several µm. However, the bonding layer 2 is not necessarily formed to have a uniform thickness due to having a smaller thickness as compared with the surface undulation of the ceramic substrate 1 and the copper plate 3, and there may be variation (in-layer variation) depending on the places.

(Details of Bonded Part and Characteristics of Bonded Substrate)

FIG. 2 and FIG. 3 show a cross-sectional view schematically illustrating a fine structure in an interface region between the bonding layer 2 and the copper plate 3 of the bonded substrate 10 (10A, 10B) according to the present embodiment.

On the other hand, FIG. 4 shows a view schematically illustrating a cross-sectional configuration of a bonded substrate 20 having a configuration different from that of the bonded substrate 10 according to the present embodiment, which is shown for comparison. Further, FIG. 5 shows a cross-sectional view schematically illustrating a fine structure in an interface region from the bonding layer 2 to the copper plate 3 of the bonded substrate 20.

The bonded substrate 10 and the bonded substrate 20 are both obtained by subjecting the ceramic substrate 1 and the copper plate 3 to heated and pressurized bonding using a brazing material containing Ag in addition to Ti; however, the bonded substrate 10 and the bonded substrate 20 are fabricated to be different from each other by making the bonding conditions different during the bonding.

Here, as the brazing material, it is possible to use one in which Cu, Sn, In, or the like has been added for lowering the melting point, or one in which Ti has been added to an alloy powder of these. For example, as an Ag—Cu—Ti-based brazing material, one that contains Ag, Cu, and Ti in a composition weight ratio of 30 to 70%, 0 to 40%, and 0.1 to 20%, respectively, can be exemplified, and it is also possible to use a commercially available one that satisfies these composition ranges.

In the bonded substrate 10, as illustrated in FIG. 1, the bonding layer 2 is in direct contact with the copper plate 3.

In addition, although illustration has been omitted in the schematic view of FIG. 1, in the bonded substrate 10, Ag atoms are distributed in the copper plate 3, at least in a vicinity of an interface I2 to the bonding layer 2, as schematically illustrated by dots in FIG. 2 and FIG. 3. The Ag atoms are distributed in a mode in which the concentration becomes smaller according as the distance from the interface I2 becomes larger (according as the distance to the non-bonded surface of the copper plate 3 becomes smaller). Here, FIG. 2 and FIG. 3 are illustrated such that the dots are more densely distributed in a region having a larger abundance ratio of the Ag atoms.

In view of the process of fabricating the bonded substrate 10 in which the ceramic substrate 1 and the copper plate 3 are bonded by using a brazing material, and in view of the mode of distribution of the Ag atoms in the copper plate 3, the Ag atoms existing in the copper plate 3 are none other than those that have been originally contained in the brazing material but have been diffused (solid-dissolved) into the copper plate 3 that is in a solid state, in the process of heated and pressurized bonding.

In other words, this means that the heated and pressurized bonding for obtaining the bonded substrate 10 according to the present embodiment is carried out under conditions such that the bonding layer 2 consisting of TiN is formed between the ceramic substrate 1 and the copper plate 3 and that an Ag distribution region $3d$ is formed in the copper plate 3, at least in a vicinity of the interface I2 to the bonding layer 2.

However, the abundance ratio (solid dissolution ratio) of the Ag atoms in the Ag distribution region $3d$ is at most 15 at % at the maximum.

Because Ag has a higher thermal conductivity than Cu, formation of the Ag distribution region $3d$ in the copper plate 3 produces an effect of reducing the heat resistance of the bonded substrate 10 and improving the heat-dissipating property.

Meanwhile, the bonded substrate 20 is common to the bonded substrate 10 in that the Ag distribution region $3d$ is formed in the copper plate 3; however, the bonded substrate 20 is different from the bonded substrate 10 in that the bonding layer 2 and the copper plate 3 do not directly constitute an interface and that an Ag—Cu layer (layer made of an Ag—Cu alloy) 6, which should be referred to as a subbonding layer, intervenes therebetween. The Ag—Cu layer 6 is formed approximately over the entire surface of the bonding layer 2. The Ag—Cu layer 6 is made of both of or either one of an Ag-rich phase and a Cu-rich phase. The Ag-rich phase is an Ag—Cu alloy in which Ag is contained at 80% or more, the rest being Cu. The Cu-rich phase is an Ag—Cu alloy in which Cu is contained at 80 to 96%, the rest being Ag. The compositions of both the Ag-rich phase and the Cu-rich phase may vary from the above-described composition ratio when a brazing material additive (Sn, In, or the like) is contained.

Here, the distribution state of the Ag atoms, that is, the diffusion of Ag, the presence or absence of the Ag—Cu layer 6, and the like in the copper plate 3 can be confirmed, for example, by analyzing the composition distribution using the cross-section of the bonded substrates 10 and 20 as a target by EPMA.

Speaking in a confirming manner, the Ag distribution region $3d$ in the copper plate 3 is a region formed in such a manner that Ag in the brazing material is diffused into the copper plate 3 that maintains a solid state even during the process of heated and pressurized bonding, so that the matrix of crystal lattice in the region is basically constituted of Cu atoms, and the content of Ag is slight. In contrast, the Ag—Cu layer 6 is formed in such a manner that the Ag atoms and the Cu atoms are alloyed during the process of heated and pressurized bonding, so that the Ag—Cu layer 6 is constituted of both of or either one of the Ag-rich phase and the Cu-rich phase, as described above. For this reason, the crystal lattice of the Ag—Cu layer 6 (arrangement of the Ag atoms and the Cu atoms) depends on the alloy composition. In other words, the Ag—Cu layer 6 and the Ag distribution region $3d$ in the copper plate 3 are different from each other with respect to the forming process and the composition ratio thereof.

The difference in configuration between the bonded substrate 10 and the bonded substrate 20 as described above means that the bonding conditions under which the bonded substrate 20 is formed is different from the bonding conditions under which the bonded substrate 10 is formed.

Further, such a difference in configuration between the bonded substrate 10 and the bonded substrate 20 gives a difference in the reliability of the two to the thermal cycle.

Generally, in a bonded substrate formed by bonding a ceramic substrate and another member, in the case where there is a difference in thermal expansion coefficient between a ceramic plate and another member existing along the ceramic plate, when a temperature change is given to the bonded substrate, a difference is generated in thermal expansion of the ceramic plate and the other member to generate a thermal stress. If a thermal cycle is continuously applied to such a bonded substrate, this thermal stress is repeatedly generated, and material destruction occurs in the ceramic substrate at some time point to generate cracks.

With regard to the bonded substrate 10 and the bonded substrate 20, the two are common to have a configuration in which the bonding layer 2 and the ceramic substrate 1 are adjacent to each other; however, because the bonding layer 2 has a thermal expansion coefficient of approximately the same degree as that of the ceramic substrate 1, almost no thermal stress is generated between the bonding layer 2 and the ceramic substrate 1 both in the bonded substrate 10 and in the bonded substrate 20. Considering also that the thickness of the bonding layer 2 is sufficiently small as compared with the ceramic substrate 1, the bonding layer 2 can be equated with the ceramic substrate 1 both in the bonded substrate 10 and in the bonded substrate 20 in considering the thermal stress.

On the other hand, while the copper plate 3 is adjacent to the bonding layer 2 in the bonded substrate 10, the Ag—Cu layer 6 is adjacent to the bonding layer 2 in the bonded substrate 20. Further, the copper plate 3 and the Ag—Cu layer 6 each have a thermal expansion coefficient different from that of the ceramic substrate 1. For this reason, it can be grasped that a thermal stress is generated between the copper plate 3 and the ceramic substrate 1 in the bonded substrate 10, and a thermal stress is generated between the Ag—Cu layer 6 and the ceramic substrate 1 in the bonded substrate 20.

When the bonded substrate 10 is compared with the bonded substrate 20 from this viewpoint, the copper plate 3 has a smaller proof strength (a smaller yield stress) than the Ag—Cu layer 6 against mechanical deformation, so that the thermal stress generated due to the difference in thermal expansion coefficient between the ceramic substrate 1 and the copper plate 3 in the bonded substrate 10 is smaller than the thermal stress generated due to the difference in thermal expansion coefficient between the ceramic substrate 1 and the Ag—Cu layer 6 in the bonded substrate 20. This can be stated that, when a thermal cycle is applied in the same manner, cracks are less liable to be generated in the ceramic substrate 1 in the bonded substrate 10 according to the present embodiment than in the bonded substrate 20.

This means that the bonded substrate 10 according to the present embodiment, in which the ceramic substrate 1 and the copper plate 3 are bonded in a mode where the Ag—Cu layer does not intervene while using a brazing material containing Ag and Ti, has a higher reliability to the thermal cycle than the bonded substrate 20 constituted such that the Ag—Cu layer 6 intervenes.

In further stating with respect to such a bonded substrate 10, a fine undulation is randomly present generally on the surface of the ceramic substrate 1 and the copper plate 3 constituting the bonded substrate 10, so that the interfaces I1 and I2 formed between the two and the bonding layer 2 as a result of bonding by the brazing material also have a random undulation as viewed in a microscopic view.

In addition, in more detail, as illustrated in FIG. 2, there are cases where voids 4 are discretely present at the interface I2 between the bonding layer 2 and the copper plate 3. Hereafter, the bonded substrate 10 in which the voids 4 are present in such a mode is particularly referred to as a bonded substrate 10A.

Alternatively, as illustrated by hatching in FIG. 3, there are cases where an Ag-rich phase 5 is discretely present at the interface I2. Hereafter, the bonded substrate 10 in which the Ag-rich phase 5 is present in such a mode is particularly referred to as a bonded substrate 10B. Here, the Ag-rich phase 5 is an uneven distributing region of an Ag-rich Ag—Cu alloy in which the abundance ratio of Ag exceeds 60 at % and is 100 at % or less.

However, in view of the fact that the Ag-rich phase 5 is basically discretely present at the interface I2 between the bonding layer 2 and the copper plate 3, the Ag-rich phase 5 is structurally differentiated from the Ag—Cu layer 6 that is provided in a mode of being adjacent to the entire surface of the bonding layer 2 in the bonded substrate 20. Unlike the former case, in the latter case, the bonding layer 2 and the copper plate 3 never directly constitute an interface.

The difference in configuration between the bonded substrate 10A and the bonded substrate 10B means that the bonding conditions for obtaining the two are different, under the premise that the Ag—Cu layer 6 is not formed. Here, formation of the Ag-rich phase 5 in the bonded substrate 10B can be also grasped as a situation in which the sites that may possibly become voids 4 under different bonding conditions are filled with the Ag-rich phase 5.

Also, such a difference in configuration gives a difference in the insulation breakdown voltage between the bonded substrate 10A and the bonded substrate 10B.

Generally, when a void part is present in a bonded substrate, there is a high risk that electric field is concentrated in the void part and the void part becomes a starting point of insulation breakage. For this reason, the bonded substrate 10B formed to have a voidless structure by presence of the Ag-rich phase 5 at the positions that may become voids 4 tends to have a larger insulation breakdown voltage (insulation breakage voltage) than the bonded substrate 10A in which the voids 4 are incorporated. In other words, it can be stated that the bonded substrate 10B has a higher reliability to electric insulation breakage than the bonded substrate 10A.

This means that when the Ag-rich phase 5 is allowed to be present discretely at the interface between the bonding layer 2 and the copper plate 3 to make the interface have a voidless structure in obtaining the bonded substrate by bonding the ceramic substrate 1 and the copper plate 3 in a mode in which an Ag—Cu layer does not intervene while using a brazing material containing Ag and Ti, a bonded substrate 10 having a high reliability to a thermal cycle and having a high reliability to electric insulation breakage can be realized.

Here, in such a case, the size (maximum size) of the Ag-rich phase 5 is, for example, about 0.1 µm to 3 µm in the thickness direction of the bonded substrate 10 and is, for example, about 0.1 µm to 5 µm in a plane that is perpendicular to the thickness direction. Also, the area ratio of the Ag-rich phase 5 in the plane that is perpendicular to the thickness direction should be about 1% to 20%, and the interval between the Ag-rich phases 5 should be about 1 µm to 100 µm.

<Relationship Between Bonding Conditions and Substrate Configuration>

As described above, the bonded substrate 10 (10A, 10B) according to the present embodiment is obtained by subjecting the ceramic substrate 1 and the copper plate 3 to heated and pressurized bonding using a brazing material containing Ag and Ti. With respect to the heated and pressurized bonding, a known technique can be applied; however, it is necessary to carry out the bonding at least under bonding conditions (bonding atmosphere, bonding temperature, bonding pressure, amount of spreading the brazing material) in which the Ag—Cu layer 6 is not formed. In addition, it is preferable to carry out the bonding under bonding conditions in which the interface I2 between the bonding layer 2 and the copper plate 3 comes to have a voidless structure.

First, it is necessary to set the bonding atmosphere to be vacuum or an Ar atmosphere because, if Ti as an active metal is oxidized or nitrided, it is inherently impossible to carry out the bonding.

The bonding pressure is preferably 5 MPa or more. This is because, the lower the bonding pressure is, the more the Ag—Cu layer 6 and the voids 4 tend to be formed. Also, the bonding pressure is preferably 25 MPa or less. This is because, the higher the bonding pressure is, the less likely the Ag—Cu layer 6 and the voids 4 tend to be formed; however, when the bonding pressure is too high, the ceramic substrate 1 may be destroyed at the time of bonding.

It is preferable to set the bonding temperature to be about 800° C. to 1000° C. in view of using a brazing material containing Ag and Ti. However, in a temperature range from 800° C. to 1000° C., the higher the bonding temperature is, the less likely the Ag—Cu layer 6 tends to be formed, and the lower the bonding temperature is, the more likely the Ag—Cu layer 6 tends to be formed.

It is preferable to define the application amount (application thickness) of the brazing material so that the thickness of the bonding layer obtained after bonding becomes 0.1 μm to 5 μm. The larger the application amount (application thickness) is, the more likely the Ag—Cu layer 6 tends to be formed. The smaller the application amount (application thickness) is, the less likely the Ag—Cu layer 6 tends to be formed.

For example, in the case where the bonding pressure is set to be 5 MPa to 25 MPa; the bonding temperature is set to be 850° C.; and the application amount (application thickness) of the brazing material is defined so that the thickness of the bonding layer obtained after bonding becomes 0.1 μm to 5 μm, a voidless bonded substrate 10B is obtained in which the Ag-rich phase 5 is discretely present while the Ag—Cu layer 6 is not formed.

In contrast, in the case where the bonding pressure is set to be 1 MPa to 1.5 MPa; the bonding temperature is set to be 800° C.; and the application amount (application thickness) of the brazing material is defined so that the thickness of the bonding layer obtained after bonding becomes 10 μm to 20 μm, the Ag—Cu layer 6 is eventually formed (the bonded substrate 20 is obtained).

Meanwhile, in the case where the bonding pressure is set to be 5 MPa to 25 MPa; the bonding temperature is set to be 950° C.; and the application amount (application thickness) of the brazing material is defined so that the thickness of the bonding layer obtained after bonding becomes 0.1 μm to 5 μm, a bonded substrate 10A is obtained in which voids 4 are present though both the Ag—Cu layer 6 and the Ag-rich phase 5 are not formed. This seems to be because, in the case of such bonding conditions, the Ag atoms do not remain between the bonding layer 2 and the copper plate 3 but are diffused into the copper plate 3.

As described above, according to the present embodiment, a bonded substrate having a high reliability to a thermal cycle and having an excellent heat-dissipating property can be obtained by allowing the bonded substrate obtained by subjecting a ceramic substrate and a copper plate to heated and pressurized bonding using an Ag—Cu—Ti-based brazing material to have a configuration in which Ag is diffused into the copper plate while an Ag—Cu layer does not intervene between the bonded layer made of TiN and the copper plate.

In addition, a bonded substrate having a high reliability not only to a thermal cycle but also to electric insulation breakage can be obtained by allowing the interface between the bonding layer and the copper plate in the bonded substrate in which such an Ag—Cu layer does not intervene, to have a configuration in which the Ag-rich phase is discretely present while voids are absent.

<Modified Examples>

In the above-described embodiment, the bonded substrate is configured by bonding the copper plate 3 onto one main surface side of the ceramic substrate 1. However, the bonded substrate may be configured by bonding the copper plate 3 also onto the other main surface side in a mode similar to that of the above-described embodiment. In other words, the bonded substrate may be configured by bonding the copper plate 3 to both the two main surfaces of the ceramic substrate 1.

EXAMPLES (Fabrication of Bonded Substrate and Structure Evaluation Thereof)

As Example 1 to Example 6, bonded substrates 10A at six levels in which the combination of the material and thickness of the ceramic substrate 1 and the thickness of the copper plate (Cu plate) 3 was varied in various ways were fabricated by heated and pressurized bonding.

The material of the ceramic substrate 1 was set to be silicon nitride ($Si_3N_4$) or aluminum nitride (AlN). For the silicon nitride ($Si_3N_4$) substrate, the thickness was set to be 0.32 mm. For the aluminum nitride (AlN) substrate, the thickness was set to be 0.63 mm. Also, the thickness of the copper plate 3 was varied to five levels of 0.3 mm, 0.6 mm, 1 mm, 1.5 mm, and 2.0 mm for the case where the ceramic substrate 1 was the silicon nitride ($Si_3N_4$) substrate. The thickness of the copper plate 3 was set be 0.3 mm for the case where the ceramic substrate 1 was the aluminum nitride (AlN) substrate.

As Example 7 to Example 12, bonded substrates 10B at six levels in which the combination of the material and thickness of the ceramic substrate 1 and the thickness of the copper plate 3 was set to be the same as in Example 1 to Example 6 were fabricated by heated and pressurized bonding.

As Comparative Example 1 to Comparative Example 6, bonded substrates 20 at six levels in which the combination of the material and thickness of the ceramic substrate 1 and the thickness of the copper plate 3 was set to be the same as in Example 1 to Example 6 were fabricated by heated and pressurized bonding.

In all the cases of Example 1 to Example 12 and Comparative Example 1 to Comparative Example 6, as the brazing material to be used in heated and pressurized bonding, one having a composition weight ratio of Ag: 51%, Cu: 24%, In: 11%, and Ti: 14% was used, and the bonding atmosphere was set to be vacuum.

On the other hand, for Example 1 to Example 6, the amount of spreading the brazing material was defined so that the thickness of the bonding layer obtained after bonding would be within a range of 0.1 μm to 3 μm in terms of in-layer variation. For Example 7 to Example 12, the amount of spreading the brazing material was defined so that the thickness of the bonding layer obtained after bonding would be within a range of 0.1 μm to 3 μm in terms of in-layer variation. For Comparative Example 1 to Comparative Example 6, the amount of spreading the brazing material was defined so that the thickness of the bonding layer obtained after bonding would be within a range of 13 μm to 20 μm in terms of such in-layer variation.

Also, the bonding pressure for Example 1 to Example 12 was set to be 20 MPa, and the bonding pressure for Comparative Example 1 to Comparative Example 6 was set to be 1 MPa which was a less heavy load than that for Example 1 to Example 12.

Further, as Comparative Example 7 to Comparative Example 12, bonded substrates 30 at six levels were obtained by forming a Ti film having a value of thickness within a range of 10 nm to 100 nm on the ceramic substrate 1 instead of using a brazing material while setting the combination of the material and thickness of the ceramic substrate 1 and the thickness of the copper plate 3 to be the same as in Example 1 to Example 6, superposing the copper plate 3 on the Ti film, and performing heated and pressurized bonding. The bonding atmosphere was set to be vacuum. The bonding temperature was set to be 1000° C., and the bonding pressure was set to be 20 MPa.

FIG. 6 shows a cross-sectional view schematically illustrating a fine structure in an interface region between a bonding layer 7 and a copper plate 3 of such a bonded substrate 30. As illustrated in FIG. 6, in the bonded substrate 30, the ceramic substrate 1 and the copper plate 3 are bonded by the bonding layer 7. Also, similarly to the bonded substrate 10A, voids 4 are present at an interface part between the copper plate 3 and the bonding layer 7.

With respect to each of the bonded substrates according to Example 1 to Example 12 and Comparative Example 1 to Comparative Example 12, a cut surface obtained by cutting perpendicularly to the bonding surface was observed with an electron microscope, so as to confirm the presence or absence of an Ag—Cu layer that was continuous to the bonding layer between the bonding layer and the copper plate, and to confirm the presence or absence of an Ag-rich phase. The observation was carried out at three sites as a target including the right and left ends and the central part in the substrate in-plane direction of the cut surface. The observation magnification ratio was set to be 1000 times, and the observation width at each site in the substrate in-plane direction was set to be 0.1 mm. In such a case, a region in which Ag was unevenly present with a thickness of 0.5 µm to 3 µm and a width of 0.5 µm to 5 µm was determined as an Ag-rich phase.

In addition, in order to confirm the presence or absence of Ag diffusion into the copper plate 3, a composition mapping was carried out with an EDS at each observation site of the cut surface with respect to an area of 10 µm of the copper plate 3 in the thickness direction from the bonding interface between the bonding layer 2 and the copper plate 3.

Table 1 shows a list of the conditions of the ceramic substrate and the copper plate (Cu plate), presence or absence of the Ag—Cu layer that is continuous to the bonding layer, presence or absence of Ag diffusion into the copper plate (Cu plate), and the Ag-rich phase in the bonded substrates according to Example 1 to Example 12 and Comparative Example 1 to Comparative Example 12.

TABLE 1

|  | Ceramic substrate material | Ceramic substrate thickness (mm) | Cu plate thickness (mm) | Ag—Cu layer continuous to bonding layer | Ag diffusion into Cu plate | Scattered presence of Ag-rich phase in vicinity of bonding layer |
| --- | --- | --- | --- | --- | --- | --- |
| Example 1 | $Si_3N_4$ | 0.32 | 0.3 | Absent | Present | Absent |
| Example 2 | $Si_3N_4$ | 0.32 | 0.6 | Absent | Present | Absent |
| Example 3 | $Si_3N_4$ | 0.32 | 1 | Absent | Present | Absent |
| Example 4 | $Si_3N_4$ | 0.32 | 1.5 | Absent | Present | Absent |
| Example 5 | $Si_3N_4$ | 0.32 | 2.0 | Absent | Present | Absent |
| Example 6 | AlN | 0.635 | 0.3 | Absent | Present | Absent |
| Example 7 | $Si_3N_4$ | 0.32 | 0.3 | Absent | Present | Present |
| Example 8 | $Si_3N_4$ | 0.32 | 0.6 | Absent | Present | Present |
| Example 9 | $Si_3N_4$ | 0.32 | 1 | Absent | Present | Present |
| Example 10 | $Si_3N_4$ | 0.32 | 1.5 | Absent | Present | Present |
| Example 11 | $Si_3N_4$ | 0.32 | 2.0 | Absent | Present | Present |
| Example 12 | AlN | 0.635 | 0.3 | Absent | Present | Present |
| Comparative Example 1 | $Si_3N_4$ | 0.32 | 0.3 | Present | Present | (Out of determination due to presence of Ag—Cu layer) |
| Comparative Example 2 | $Si_3N_4$ | 0.32 | 0.6 | Present | Present |  |
| Comparative Example 3 | $Si_3N_4$ | 0.32 | 1 | Present | Present |  |
| Comparative Example 4 | $Si_3N_4$ | 0.32 | 1.5 | Present | Present |  |
| Comparative Example 5 | $Si_3N_4$ | 0.32 | 2.0 | Present | Present |  |
| Comparative Example 6 | AlN | 0.635 | 0.3 | Present | Present |  |
| Comparative Example 7 | $Si_3N_4$ | 0.32 | 0.3 | Absent | Absent | Absent |
| Comparative Example 8 | $Si_3N_4$ | 0.32 | 0.6 | Absent | Absent | Absent |
| Comparative Example 9 | $Si_3N_4$ | 0.32 | 1 | Absent | Absent | Absent |
| Comparative Example 10 | $Si_3N_4$ | 0.32 | 1.5 | Absent | Absent | Absent |
| Comparative Example 11 | $Si_3N_4$ | 0.32 | 2.0 | Absent | Absent | Absent |
| Comparative Example 12 | AlN | 0.635 | 0.3 | Absent | Absent | Absent |

As shown in Table 1, Example 1 to Example 12 were common to each other in that the Ag—Cu layer that was continuous to the bonding layer was absent and that Ag was diffused into the copper plate 3. However, in Example 1 to Example 6, the Ag-rich phase was absent, whereas in Example 7 to Example 12, the Ag-rich phase was present.

Here, in Example 1 to Example 6, voids were present at the interface between the bonding layer and the copper plate. Also, the mode of distribution of the Ag-rich phase in Example 7 to Example 12 was similar to the mode of distribution of the voids in Example 1 to Example 6. FIG. 7 shows a view showing together an SEM image (upper stage) with respect to an interface vicinity of Example 9 and an EPMA element mapping image (lower stage) with respect to Ti, Ag, and Cu. From FIG. 7, it is confirmed that Ag is diffused into the copper plate in the thickness direction and that Ag is distributed at a lower concentration in a place according as the place is more distant from the interface between the bonding layer and the copper plate, and in addition, that Ag is locally unevenly present at the interface between the bonding layer and the copper plate, that is, that the Ag-rich phase is present (a fine region that appears to be white in the Ag mapping image is the Ag-rich phase). Such a result seems to suggest that formation of the Ag-rich phase occurs at sites that may be voids under different bonding conditions.

Furthermore, in Comparative Example 1 to Comparative Example 6, the Ag—Cu layer that was continuous to the bonding layer was present, so that determination was not carried out on the Ag-rich phase.

On the other hand, in Comparative Example 7 to Comparative Example 12, the Ag—Cu layer that was continuous to the bonding layer was absent likewise in Example 1 to Example 12; however, Comparative Example 7 to Comparative Example 12 were different from Example 1 to Example 12 in that the diffusion of Ag into the copper plate was not confirmed.

(Thermal Cycle Test)

With respect to each of the bonded substrates according to Example 1 to Example 12 and Comparative Example 1 to Comparative Example 12, a thermal cycle test was carried out. In each of the Examples and Comparative Examples, the number of test samples was set to be five. The test was carried out by giving to each sample a thermal cycle of −55° C. (15 minutes)/150° C. (15 minutes) for 3000 cyc (cycles), during which, for every 100 cycles (that is, for a total of 30 times), confirmation was made on peeling-off of the bonding part and presence or absence of cracks in the ceramic substrate (hereafter, these are generally referred to as "destruction" together) by an outer appearance confirmation with a stereoscopic microscope and ultrasonic flaw detection.

Table 2 shows a list of the evaluation timing at which the destruction was confirmed (how many times of evaluation at which the destruction was confirmed) in the thermal cycle test with respect to all the samples of the bonded substrates according to Example 1 to Example 12 and Comparative Example 1 to Comparative Example 12, and an average value for the respective five samples. For example, if the destruction was confirmed at the 29th evaluation timing, it means that the destruction occurred between the 2800th cycle and the 2900th cycle. A sample in which no destruction was confirmed at the 30th evaluation after giving 3000 cycles of the thermal cycle is denoted as "not confirmed".

TABLE 2

Evaluation timing at which destruction was confirmed by thermal cycle test
(unit: $n^{th}$ time, evaluation was carried out for evety 100 cycles until 3000th cycle)

|  | Example 1 | Example 2 | Example 3 | Example 4 | Example 5 | Example 6 |
| --- | --- | --- | --- | --- | --- | --- |
| #1 | Not confirmed | Not confirmed | Not confirmed | Not confirmed | 25 | 16 |
| #2 | Not confirmed | Not confirmed | Not confirmed | Not confirmed | 23 | 17 |
| #3 | Not confirmed | Not confirmed | Not confirmed | Not confirmed | 27 | 16 |
| #4 | Not confirmed | Not confirmed | Not confirmed | Not confirmed | 28 | 17 |
| #5 | Not confirmed | Not confirmed | Not confirmed | Not confirmed | 26 | 17 |
| Average | Not confirmed | Not confirmed | Not confirmed | Not confirmed | 25.8 | 16.6 |

|  | Example 7 | Example 8 | Example 9 | Example 10 | Example 11 | Example 12 |
| --- | --- | --- | --- | --- | --- | --- |
| #1 | Not confirmed | Not confirmed | Not confirmed | Not confirmed | 26 | 17 |
| #2 | Not confirmed | Not confirmed | Not confirmed | Not confirmed | 25 | 19 |
| #3 | Not confirmed | Not confirmed | Not confirmed | Not confirmed | 27 | 17 |
| #4 | Not confirmed | Not confirmed | Not confirmed | Not confirmed | 28 | 18 |
| #5 | Not confirmed | Not confirmed | Not confirmed | Not confirmed | 28 | 17 |
| Average | Not confirmed | Not confirmed | Not confirmed | Not confirmed | 26.8 | 17.6 |

|  | Comparative Example 1 | Comparative Example 2 | Comparative Example 3 | Comparative Example 4 | Comparative Example 5 | Comparative Example 6 |
| --- | --- | --- | --- | --- | --- | --- |
| #1 | 14 | 10 | 7 | 9 | 5 | 6 |
| #2 | 10 | 11 | 6 | 5 | 5 | 8 |
| #3 | 12 | 12 | 8 | 5 | 4 | 6 |
| #4 | 13 | 8 | 10 | 7 | 3 | 10 |
| #5 | 14 | 11 | 11 | 7 | 6 | 6 |
| Average | 12.6 | 10.4 | 8.4 | 6.6 | 4.6 | 7.2 |

|  | Comparative Example 7 | Comparative Example 8 | Comparative Example 9 | Comparative Example 10 | Comparative Example 11 | Comparative Example 12 |
| --- | --- | --- | --- | --- | --- | --- |
| #1 | 4 | 3 | 5 | 5 | 3 | 5 |
| #2 | 1 | 5 | 1 | 1 | 6 | 4 |
| #3 | 2 | 5 | 3 | 3 | 3 | 3 |

TABLE 2-continued

| | Evaluation timing at which destruction was confirmed by thermal cycle test (unit: n$^{th}$ time, evaluation was carried out for every 100 cycles until 3000th cycle) | | | | | |
|---|---|---|---|---|---|---|
| #4 | 5 | 5 | 1 | 3 | 6 | 3 |
| #5 | 2 | 4 | 4 | 4 | 6 | 6 |
| Average | 2.8 | 4.4 | 2.8 | 3.2 | 4.8 | 4.2 |

As shown in Table 2, in Example 1 to Example 5 and Example 7 to Example 11 in which silicon nitride (Si$_3$N$_4$) was used as the ceramic substrate, the destruction was confirmed generally at the 25th evaluation timing and afterwards. In particular, in Example 1 to Example 4 and Example 7 to Example 10 in which the thickness of the copper plate 3 was small, the destruction was not confirmed even at the 30th evaluation timing after giving 3000 cycles of the thermal cycle in all the samples.

Meanwhile, in Example 6 and Example 12 in which aluminum nitride (AlN) was used as the ceramic substrate, the destruction was confirmed at the 16th to 17th evaluation timing in average.

In contrast, in Comparative Example 1 to Comparative Example 6 in which the Ag—Cu layer had been formed, the destruction was confirmed by the 14th evaluation timing at the latest. In Comparative Example 7 to Comparative Example 12 in which diffusion of Ag into the copper plate was not confirmed, the destruction was confirmed by the 6th evaluation timing at the latest.

The above-described results indicate that the bonded substrates 10A and 10B according to Example 1 to Example 12 configured such that the Ag—Cu layer does not intervene and Ag is diffused into the copper plate have a higher reliability to the thermal cycle as compared with the bonded substrate 20 according to Comparative Example 1 to Comparative Example 6 in which the Ag—Cu layer intervenes and the bonded substrate 30 according to Comparative Example 7 to Comparative Example 12 in which Ag is not diffused into the copper plate. In particular, regarding comparison with Comparative Example 1 to Comparative Example 6, it can be stated that the effect of reduction of the thermal stress generated in the ceramic substrate due to no intervening of the Ag—Cu layer is exhibited.

(Module Thermal Resistance Measurement)

A thermal resistance measurement was carried out on each of the bonded substrates according to Example 1 to Example 12 and Comparative Example 1 to Comparative Example 12 as a target. As a sample for evaluation, a bonded substrate was prepared in which a copper plate having a plane size of 20 mm×20 mm had been bonded to both surfaces of a ceramic substrate having a plane size of 21 mm×21 mm under the conditions according to each Example or Comparative Example.

Further, a semiconductor chip having a size of 8 mm×8 mm was mounted by soldering at the center on one side of the bonded substrate. Then, the other surface of copper plate that is opposite to the semiconductor chip mounting surface with the ceramic substrate sandwiched therebetween was bonded by soldering onto a copper base plate having a plane size of 50 mm×50 mm and a thickness of 4 mm, and the copper base plate was disposed on a cooling plate via a thermal grease to obtain a module for evaluation.

The measurement was carried out in accordance with the standard JESD51-14 of JEDEC. In each of the Examples and Comparative Examples, the number of test samples was set to be five.

Table 3 shows a list of the result of thermal resistance measurement with respect to all the samples of the bonded substrates according to Example 1 to Example 12 and Comparative Example 1 to Comparative Example 12 and an average value for the respective five samples.

TABLE 3

| Thermal resistance measurement result (unit: K/W) | | | | | | |
|---|---|---|---|---|---|---|
| | Example 1 | Example 2 | Example 3 | Example 4 | Example 5 | Example 6 |
| #1 | 0.151 | 0.148 | 0.135 | 0.137 | 0.137 | 0.204 |
| #2 | 0.145 | 0.141 | 0.138 | 0.140 | 0.134 | 0.201 |
| #3 | 0.153 | 0.147 | 0.139 | 0.135 | 0.139 | 0.203 |
| #4 | 0.155 | 0.149 | 0.137 | 0.139 | 0.132 | 0.206 |
| #5 | 0.148 | 0.146 | 0.139 | 0.140 | 0.133 | 0.201 |
| Average | 0.150 | 0.146 | 0.138 | 0.138 | 0.135 | 0.203 |
| | Example 7 | Example 8 | Example 9 | Example 10 | Example 11 | Example 12 |
| #1 | 0.154 | 0.149 | 0.139 | 0.138 | 0.138 | 0.208 |
| #2 | 0.149 | 0.143 | 0.139 | 0.141 | 0.137 | 0.202 |
| #3 | 0.155 | 0.151 | 0.139 | 0.138 | 0.139 | 0.204 |
| #4 | 0.155 | 0.151 | 0.139 | 0.142 | 0.137 | 0.206 |
| #5 | 0.148 | 0.151 | 0.139 | 0.141 | 0.137 | 0.204 |
| Average | 0.152 | 0.149 | 0.139 | 0.140 | 0.137 | 0.205 |
| | Comparative Example 1 | Comparative Example 2 | Comparative Example 3 | Comparative Example 4 | Comparative Example 5 | Comparative Example 6 |
| #1 | 0.151 | 0.148 | 0.143 | 0.139 | 0.139 | 0.205 |
| #2 | 0.154 | 0.144 | 0.147 | 0.140 | 0.142 | 0.201 |
| #3 | 0.148 | 0.151 | 0.143 | 0.144 | 0.141 | 0.211 |
| #4 | 0.151 | 0.144 | 0.143 | 0.143 | 0.142 | 0.209 |
| #5 | 0.155 | 0.148 | 0.143 | 0.140 | 0.143 | 0.207 |

TABLE 3-continued

| Thermal resistance measurement result (unit: K/W) | | | | | |
|---|---|---|---|---|---|
| Average | 0.152 | 0.147 | 0.144 | 0.141 | 0.142 | 0.207 |

| | Comparative Example 7 | Comparative Example 8 | Comparative Example 9 | Comparative Example 10 | Comparative Example 11 | Comparative Example 12 |
|---|---|---|---|---|---|---|
| #1 | 0.276 | 0.261 | 0.261 | 0.260 | 0.252 | 0.344 |
| #2 | 0.266 | 0.271 | 0.263 | 0.248 | 0.254 | 0.334 |
| #3 | 0.271 | 0.258 | 0.263 | 0.251 | 0.257 | 0.334 |
| #4 | 0.279 | 0.266 | 0.253 | 0.256 | 0.245 | 0.341 |
| #5 | 0.271 | 0.271 | 0.258 | 0.248 | 0.247 | 0.341 |
| Average | 0.273 | 0.265 | 0.260 | 0.253 | 0.251 | 0.339 |

As shown in Table 3, among the bonded substrates in which silicon nitride ($Si_3N_4$) was used as the ceramic substrate, in Example 1 to Example 5, Example 7 to Example 11, and Comparative Example 1 to Comparative Example 5 in which diffusion of Ag into the copper plate occurred, the value of thermal resistance is approximately about 0.135 K/W to 0.15 K/W, whereas in Comparative Example 7 to Comparative Example 11 in which diffusion of Ag into the copper plate did not occur, the value of thermal resistance tends to be as high as approximately about 0.25 K/W to 0.28 K/W. Also, such a tendency is seen also between Example 6, Example 12, and Comparative Example 6 (the value of thermal resistance is approximately about 0.20 K/W to 0.21 K/W), and Comparative Example 12 (the value of thermal resistance is approximately about 0.334 K/W to 0.341 K/W) all of which aluminum nitride (AlN) was used as the ceramic substrate, though the absolute values are different.

The above-described results indicate that an effect of reducing the thermal resistance of the bonded substrate is produced by allowing Ag having a higher thermal conductivity than Cu to be diffused into the copper plate.

(Insulation Breakdown Voltage Measurement)

An insulation breakdown voltage (insulation breakage voltage) measurement was carried out on each of the bonded substrates according to Example 1 to Example 12 as a target. In each of the Examples, the number of test samples was set to be ten. The measurement was carried out by applying an alternating-current voltage between a non-bonded surface of the copper plate serving as a circuit surface of the bonded substrate and a non-bonded surface of the ceramic substrate serving as a heat-dissipating surface, in an insulating oil.

Table 4 shows a list of the result of measurement of insulation breakdown voltage as well as an average value with respect to all the samples of the bonded substrates according to Example 1 to Example 12 and standard deviation $\sigma$ for the respective ten samples.

TABLE 4

| Insulation breakdown voltage measurement result (unit: kV/mm) | | | | | | |
|---|---|---|---|---|---|---|
| | Example 1 | Example 2 | Example 3 | Example 4 | Example 5 | Example 6 |
| #1 | 6.0 | 9.3 | 5.5 | 10.3 | 9.4 | 7.2 |
| #2 | 6.9 | 8.6 | 8.7 | 7.9 | 10.6 | 6.7 |
| #3 | 8.0 | 6.5 | 9.1 | 10.0 | 9.3 | 8.3 |
| #4 | 5.1 | 7.9 | 6.2 | 9.0 | 6.4 | 6.7 |
| #5 | 5.0 | 9.5 | 6.3 | 5.4 | 7.9 | 7.9 |
| #6 | 9.2 | 5.3 | 8.8 | 7.7 | 5.8 | 6.0 |
| #7 | 7.2 | 6.5 | 5.9 | 6.0 | 6.5 | 6.6 |
| #8 | 6.5 | 8.1 | 6.9 | 5.6 | 10.3 | 6.0 |
| #9 | 5.9 | 7.4 | 5.8 | 6.0 | 9.3 | 6.4 |
| #10 | 9.4 | 7.8 | 9.9 | 7.4 | 7.7 | 6.0 |
| Average | 6.9 | 7.7 | 7.3 | 7.5 | 8.3 | 6.8 |
| $\sigma$ | 1.6 | 2.0 | 1.6 | 1.8 | 1.7 | 2.1 |
| | Example 7 | Example 8 | Example 9 | Example 10 | Example 11 | Example 12 |
| #1 | 11.1 | 9.0 | 8.5 | 8.5 | 9.9 | 7.9 |
| #2 | 9.9 | 9.2 | 9.0 | 9.1 | 8.1 | 7.5 |
| #3 | 7.7 | 8.4 | 10.8 | 7.4 | 9.5 | 7.9 |
| #4 | 11.0 | 8.0 | 11.2 | 10.6 | 8.0 | 10.3 |
| #5 | 10.6 | 9.7 | 11.2 | 10.3 | 7.7 | 11.1 |
| #6 | 10.9 | 7.9 | 8.4 | 11.1 | 7.8 | 9.4 |
| #7 | 9.9 | 10.0 | 8.1 | 10.9 | 8.1 | 10.8 |
| #8 | 10.1 | 10.8 | 9.1 | 9.9 | 10.3 | 8.6 |
| #9 | 8.9 | 9.6 | 10.6 | 9.7 | 10.3 | 10.7 |
| #10 | 7.9 | 7.9 | 8.5 | 11.1 | 8.7 | 9.2 |
| Average | 9.8 | 9.1 | 9.5 | 9.9 | 8.8 | 9.3 |
| $\sigma$ | 1.2 | 1.0 | 1.3 | 1.2 | 1.1 | 1.3 |

As shown in Table 4, in Example 1 to Example 6 in which the Ag-rich phase was not confirmed while voids were confirmed at the interface between the bonding layer and the copper plate, the average value of the insulation breakdown voltage was 8.3 kV/mm at the maximum, and the value of $\sigma$ was 1.6 kV/mm at the minimum. In contrast, in Example 7 to Example 12 in which the Ag-rich phase was confirmed while voids were not confirmed at the interface between the bonding layer and the copper plate, the average value of the insulation breakdown voltage was 8.8 kV/mm at the minimum, and the value of σ was 1.3 kV/mm at the maximum.

The above-described results indicate that an effect of enhancing the reliability to electric insulation breakage is produced by preventing voids from being generated at the interface between the bonding layer and the copper plate and allowing the Ag-rich phase to intervene instead.

The invention claimed is:

1. A bonded substrate including a copper plate bonded to one or both main surface(s) of a nitride ceramic substrate, wherein
    a bonding layer consisting of TiN intervenes between said nitride ceramic substrate and said copper plate and is adjacent at least to said copper plate, and
    an Ag distribution region in which Ag atoms are distributed is present in said copper plate.

2. The bonded substrate according to claim 1, wherein an Ag-rich phase is present discretely at an interface between said bonding layer and said copper plate.

3. The bonded substrate according to claim 2, wherein said Ag distribution region is present in said copper plate to be in contact with an interface between said copper plate and said bonding layer.

4. The bonded substrate according to claim 1, wherein said Ag distribution region is present in said copper plate to be in contact with an interface between said copper plate and said bonding layer.

5. A method for manufacturing a bonded substrate including a copper plate bonded to one or both main surface(s) of a nitride ceramic substrate, the method comprising:
    an application step of spreading a brazing material paste containing Ag, Cu, and Ti to one or both main surface(s) of said nitride ceramic substrate; and
    a bonding step of heating and pressurizing said copper plate and said nitride ceramic substrate in vacuum or in an Ar atmosphere in a state in which said copper plate is superposed onto the surface(s) of said nitride ceramic substrate where said brazing material paste has been applied, wherein
    by performing said application step and said bonding step, in said bonded substrate,
    a bonding layer consisting of TiN is generated between said nitride ceramic substrate and said copper plate so as to be adjacent at least to said copper plate, and
    Ag contained in said brazing material paste is diffused in said copper plate to form an Ag distribution region in said copper plate.

6. The method for manufacturing a bonded substrate according to claim 5, wherein, by performing said application step and said bonding step, further in said bonded substrate, an Ag-rich phase is made to be present discretely at an interface between said bonding layer and said copper plate.

7. A bonded substrate including a copper plate bonded to one or both main surface(s) of a nitride ceramic substrate, wherein
    a bonding layer including TiN as a major component intervenes between said nitride ceramic substrate and said copper plate and is in direct contact with said copper plate, and
    an Ag diffusion region in which Ag atoms are diffused into said copper plate is present.

8. The bonded substrate according to claim 7, wherein an Ag-rich phase is present discretely at an interface between said bonding layer and said copper plate.

9. The bonded substrate according to claim 7, wherein said Ag diffusion region is present in said copper plate to be in contact with an interface between said copper plate and said bonding layer.

* * * * *